United States Patent [19]

Murata et al.

[11] Patent Number: 4,691,104
[45] Date of Patent: Sep. 1, 1987

[54] ONE-DIMENSIONAL PYROELECTRIC SENSOR ARRAY

[75] Inventors: Michihiro Murata; Katsuhiko Tanaka; Hiroyuki Seto, all of Nagaokakyo, Japan

[73] Assignee: Murata Manufacturing Co., Ltd., Japan

[21] Appl. No.: 743,950

[22] Filed: Jun. 12, 1985

[30] Foreign Application Priority Data

Jun. 14, 1984 [JP] Japan .................. 59-123423

[51] Int. Cl.$^4$ .............................................. G01J 5/10
[52] U.S. Cl. .................... 250/338; 250/342; 250/349
[58] Field of Search ................ 250/338, 349, 342

[56] References Cited

U.S. PATENT DOCUMENTS

| | | | |
|---|---|---|---|
| 4,383,174 | 5/1983 | Matsumura et al. | 250/338 PY |
| 4,441,023 | 4/1984 | Doctor et al. | 250/338 PY |
| 4,475,040 | 10/1984 | Matsumoto et al. | 250/338 PY |
| 4,532,424 | 7/1985 | Cheung | 250/338 PY |

FOREIGN PATENT DOCUMENTS

| | | | |
|---|---|---|---|
| 120830 | 7/1982 | Japan | 250/338 PY |
| 0032828 | 2/1984 | Japan | 250/338 PY |

Primary Examiner—Carolyn E. Fields
Assistant Examiner—Richard Hanig
Attorney, Agent, or Firm—Ostrolenk, Faber, Gerb & Soffen

[57] ABSTRACT

A one-dimensional pyroelectric sensor array comprises (1) a base plate made of a pyroelectric material; a plurality of strip elements made of pyroelectric material having a heat-sensitive region at a free end thereof, each supported only at the other end to the base plate to form an integrated structure with the base plate; and (2) one pair of detecting electrodes formed on the heat-sensitive region of the free end of each strip element.

16 Claims, 32 Drawing Figures

ONE-DIMENSIONAL PYROELECTRIC SENSOR ARRAY

FIELD OF THE INVENTION

This invention relates to a one-dimensional pyroelectric sensor array.

PRIOR ART

A pyroelectric material generates electric charges on its surface according to ambient temperature or any change of temperature, and a pyroelectric light sensor which comprises a pyroelectric material can detect the incident light thermally.

A pyroelectric infrared sensor has the following characteristics. First, the sensitivity depends weakly on the wavelength of light. Second, the respones is fast and the sensitivity is high at room temperature.

A pyroelectric sensor may have the form of a linear array sensor as well as the form of a single sensor having one sensing area. A linear array sensor comprises a plurality of pyroelectric elements which are arranged linearly. It is desirable that the array consists of minute pyroelectric elements in order to improve the resolution in space of an optical system in which the array sensor is used.

FIG. 1(a) is a plan view, and FIG. 1(b) a sectional view, along line A—A in FIG. 1(a), of a prior art pyroelectric sensor of the linear array type which is disclosed in JP-A No. 120830/1982. An insulating substrate 1 has a window 2. A pyroelectric sensor array 3 made from pyroelectric material such as lead zirconium titanate ceramics and lead titanate ceramics is placed on the substrate 1 so as to cover the window 2, and it is fixed with an electrically conductive bonding agent 4 to the substrate 1. The pyroelectric sensor array 3 consists of a plurality of pyroelectric elements 3a which are separated by slits 5 therebetween and are arranged along the longitudinal direction of the sensor. Electrodes 6, 7 are formed on the upper and lower surface of each pyroelectric element 3a. All electrodes 7 are electrically connected to each other, and they are furthermore connected with an external circuit with the conductive bonding agent 4 mentioned above. Each electrode 6 is connected to an input terminal of a drive circuit (not shown) so that the output signal thereof can be sensed in time series.

A pyroelectric sensor of the linear array type mentioned above has an advantage that the single plate structure of the pyroelectric elements 3a allows their size to be made minute easily. Furthermore, cross talk between the elements can be decreased and the sensitivity thereof can be increased because the pyroelectric elements 3a are substantially separated from each other.

However, it has following problems to be solved. Because of the single plate structure of pyroelectric elements 3a, heat still diffuses via both ends of each pyroelectric element 3a despite their separation so that the sensitivity can not be increased and the cross talk can not be decreased sufficiently.

SUMMARY OF THE INVENTION

An object of the present invention is to provide a pyroelectric sensor of the linear array type which has a higher sensitivity and less cross talk.

A one-dimensional pyroelectric sensor array according to the present invention comprises (1) a base plate made of pyroelectric material; (2) a plurality of strip elements made of pyroelectric material having a heat-sensitive region at a free end thereof, each supported only at the other end to the base plate to form an integrated structure with the base plate; (3) and at least one pair of detecting electrodes formed on the free end of the heat-sensitive region of each strip element.

BRIEF DESCRIPTION OF DRAWINGS

Embodiments of the invention will now be described by way of examples and with reference to the accompanying drawings, in which.

EMBODIMENTS

Figure 2A:
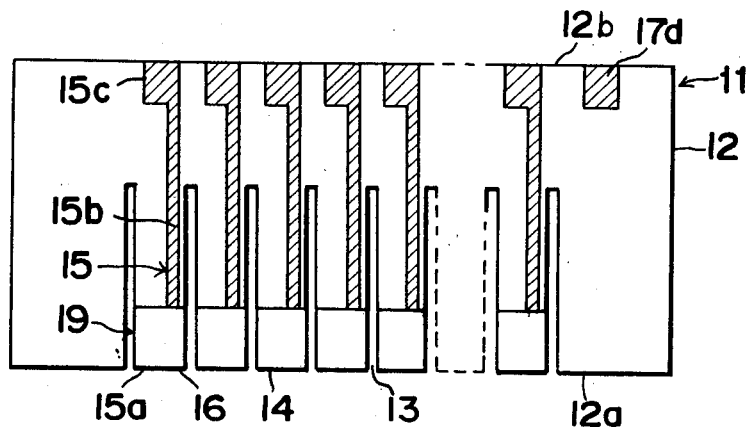
FIGS. 2(a) and 2(b) are a top and bottom plan view of a pyroelectric sensor of a first embodiment according to the invention, respectively.
Figure 2B:
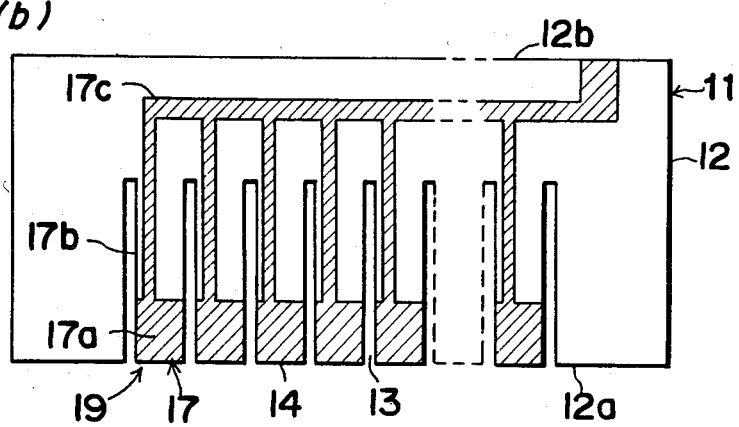
Figure 2C:
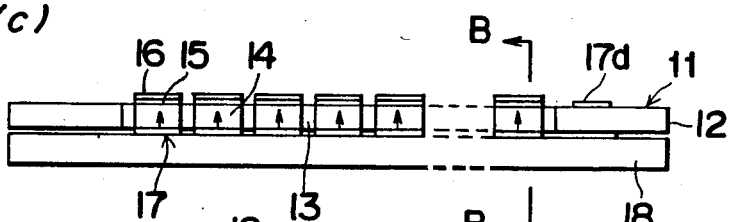
FIG. 2(c) and FIG. 2(d) are an elevational view and a sectional view along line B—B in FIG. 2(c), respectively, of a pyroelectric sensor fixed to a supporter.
Figure 2D:
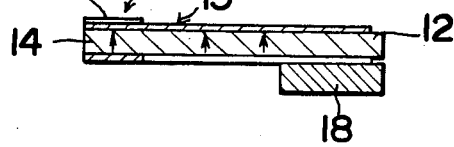

Referring now to the drawings, wherein like reference characters designate like or corresponding parts through the several views, FIGS. 2(a)–(d) show a first embodiment according to the present invention. FIG. 2(a) and FIG. 2(b) are a top and bottom plan view of a pyroelectric sensor 11 of the linear array type, respectively. FIG. 2(c) and FIG. 2(d) are an elevational view and a sectional view along line B—B in FIG. 2(c), respectively, of the pyroelectric sensor fixed to a supporter 18.

The pyroelectric sensor 11 comprises a plate 12 made of a pyroelectric material such as lead zirconium titanate ceramics, lead titanium ceramics and lithium tantalate. The plate 12 can be prepared by a well-known process. It is a rectangle which elongates from left to right in FIGS. 2(a)–(d). Long and narrow spaces 13 are formed through the plate 12 vertically, and they extend from a first side 12a of the plate 12 halfway towards a second side 12b. Thus, pyroelectric segments 14 are formed between the spaces 13, and they have free ends at the first side 12a.

First electrodes 15 are formed on the upper surface of the plate 12. Each first electrode 15 consists of a light-receiving part 15a placed near the free end of a pyroelectric segment 14, a connecting part 15c near the second side 12c of the plate 12 and an extension part 15b connecting both parts 15a, 15c. A light-absorbing film 16 of a material such as Ni-Cr and platinum black is formed just on the light-receiving part 15a. The light-receiving part 15a, as well as a ground part 17a of the counterpart electrode 17 which will be mentioned below serves as a detecting electrode to sense the heat. The extension parts 15b and the connecting parts 15c are used to transmit an electric signal to an external driver circuit which will be explained below.

Alternatively, the light receiving part 15a can be made of a material such as carbon paint and metal black material instead of forming a light-absorbing layer on the light-receiving part 15a. Furthermore, both extension part 15b and connecting part 15c can also be made of such a material as mentioned above.

Second electrodes 17 are formed on the bottom surface of the plate 12 in correspondence with the first electrodes 15. A second electrode 17 consists of a ground part 17a placed near the free end of a pyroelectric segment 14, a connecting part 17c near the side 12b and an extension part 17b connecting both ground part 15a and connecting part 17c. The connecting part 17c is common to all second electrodes 17, and it is further connected out to a folded part 17d formed on the upper surface of the plate 12. The extension parts 17b, the connecting part 17c and the folded part 17d are used to transmit the electric signal to a driver circuit which will be explained below. The ground part 17a is located just opposite to the light-receiving part 15a, and serves as a detecting electrode which makes a pair with the above-mentioned light-receiving part 15a. The extension parts 17b and the connecting part 17c of second electrodes 17 are formed so as not to overlap with the extension parts 15b and the connecting parts 15c of first electrodes 15, as shown in FIGS. 2(a), (b); this arrangement reduces the capacitance, and this increases the sensitivity to the light.

The pyroelectric sensor 11 is fixed to a supporter 18 on its bottom surface near the side 12b.

A detector part 19 comprises a light-receiving part 15a of a first electrode 15, a ground part 17a, pyroelectric material between them, and the light-absorbing film 16. If the light is incident on the light-absorbing film 16, electric charges appear on the surface of the pyroelectric material, and the amount of the generated charges can be detected by a driver circuit which will be explained below.

Figure 1A:
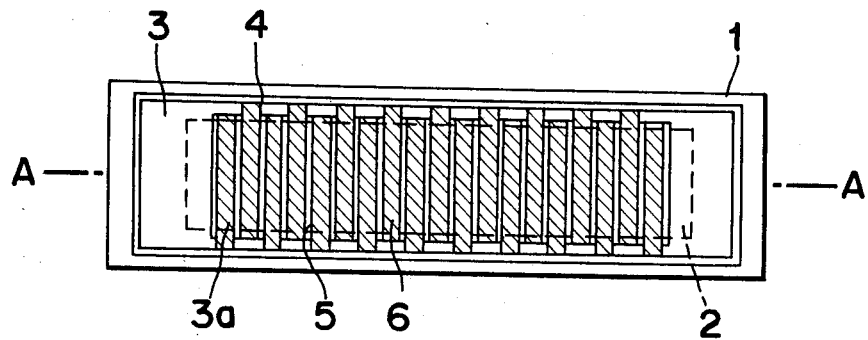
FIG. 1(a) is a plan view and FIG. 1(b) a sectional view, along line A—A in FIG. 1(a), of a prior art pyroelectric sensor of the linear array type.
Figure 1B:
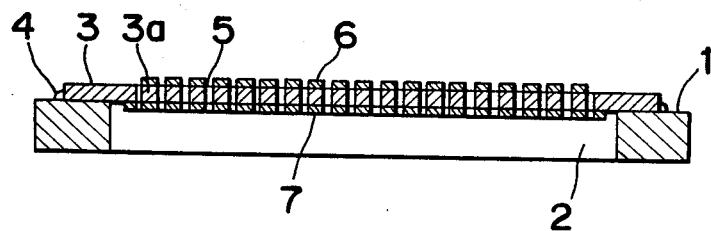
Figure 3:
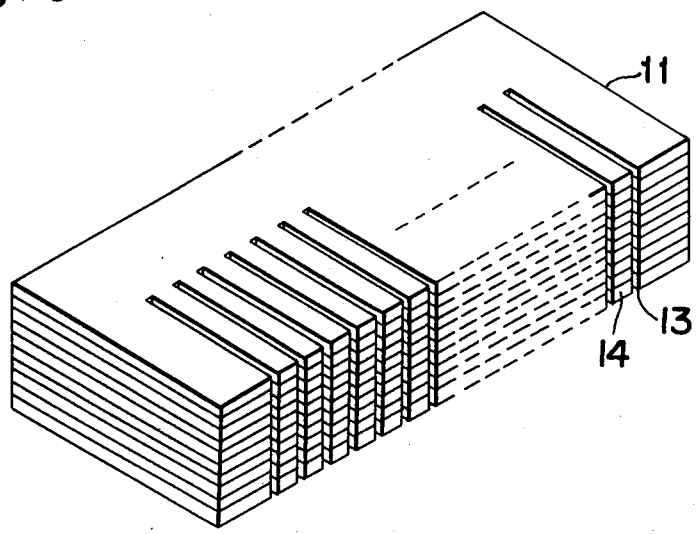
FIG. 3 is a perspective view of a step in a production process of a first embodiment of the invention.

A pyroelectric sensor of the linear array type mentiond above can be produced by following steps:

(1) preparing a plate 12 of pyroelectric material;
(2) polishing both surfaces of the plate 12 for example to thickness 50 μm to result in mirror planes;
(3) forming first electrodes 15 on the top surface of the plate 12;
(4) forming second electrodes 17 on the bottom surfce of the plate 12;
(5) polarizing the pyroelectric material by applying a voltage between a first electrode 15 and a corresponding second electrode 17. The direction of the polarization is shown with arrows in FIGS. 2(c), (d). The direction of the polarization may be the reverse;
(6) laying a plurality of plates 12 in a stack, and fixing them with wax as shown in FIG. 3;
(7) forming slits for defining spaces 13 by using, for example, a dicing saw, laser beam cutting, chemical etching, plasma etching, or both chemical etching and laser beam cutting;
(8) separating the plates 12 into each plurality of individual plates 12;
(9) forming a light-absorbing film 16 on each light-receiving part 15a; and
(10) connecting lead wires each to connecting parts 15c of first electrodes 15 and to the folded part 17d by using a bonding process.

The production steps of a pyroelectric sensor can also be arranged as follows: (1) - (2) - (6) - (7) - (8) - (3) - (4) - (5) - (9) - (10), or (1) - (2) - (3) - (4) - (6) - (7) - (8) - (5) - (9) - (10).

The step (6) (FIG. 3) makes it possible to produce a large amount of pyroelectric plates 12 by stacking a plurality of plates 12 and forming slits or spaces 13.

Figure 4:
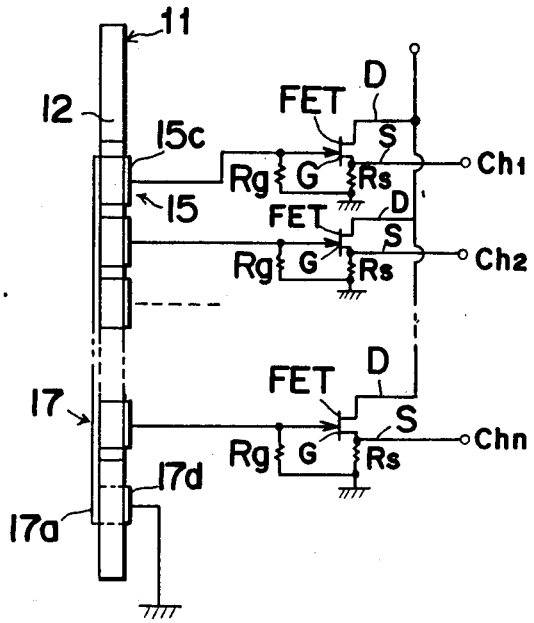
FIG. 4 is an example of a schematic diagram of a driver circuit.

The pyroelectric sensor of the linear array type can be driven as follows:

FIG. 4 shows an example of a driver circuit. A connecting part 15c (output terminal) of each first electrode 15 is connected to a gate electrodes G of a field-effect transistor FET, and to ground via a resistor $R_g$. A dc voltage is applied to a drain electrode D of FET, and a resistor $R_s$ is connected between a source electrode S of FET and ground. The output signal (Ch 1, Ch2, ... ) is taken out from the source electrode S. On the other hand, the ground part 17a of each second electrode 17 is connected to ground via the connecting part 17c and the folded part 17d.

If the light is incident on the light-absorbing film 16 (not shown in FIG. 4 for clarity), the temperature of the pyroelectric material in the detector part 19 rises, and electric charges appear on the surface of the pyroelectric material. The amount of the charges depends on the difference in temperature between the pyroelectric material and the environment. Then, a current flows down the resistor $R_g$ to generate a voltage drop at $R_g$. The voltage drop across $R_g$ drives the FET and is taken out as the voltage drop at the resistor $R_s$ superposed with the dc bias voltage (through a source-follower circuit of FET which transforms the impedence of the input signal) from the source electrode S.

Thus, if the light is incident on all areas of the pyroelectric sensor 11, each channel Ch1, Ch2 ..., Chn provides an output signal. On the other hand, if the light is incident only on a part of the pyroelectric sensor 11, output signals appear only at the channels corresponding to the illuminated part.

If a material which radiates the light is stationary, a chopper should be placed over first electrodes 15 above the top surface of the pyroelectric sensor 11. Furthermore, a temperature correction sensor should provided and equipped to detect the difference in temperature between the pyroelectric material and the environment. On the other hand, if the material is moving or if the intensity of the radiation of the material varies, no chopper is needed.

Figure 5:
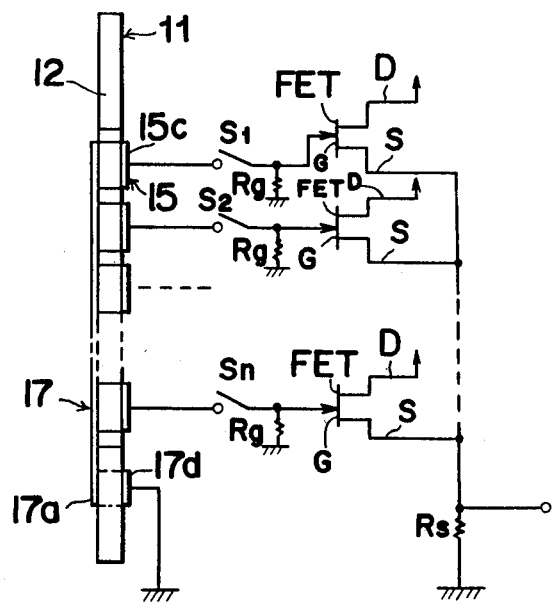
FIG. 5 is another example of a schematic diagram of a driver circuit.

FIG. 5 shows another example of a driver circuit which can drive a pyroelectric sensor in time series. In this circuit, connecting parts (output terminals) 15c of first electrodes 15 are each connected to the gate electrodes G of an FET via switches S1, S2, ..., Sn, and the gate electrode G is connected to ground via a resistor $R_g$. A dc voltage is applied to drain electrodes D of each FET. The source electrodes S are connected to ground via a common resistor $R_s$, and the voltage drop at $R_g$ is taken out as the voltage drop at the resistor $R_s$ superposed with the dc bias voltage (through a source-follower circuit of FET which transforms the impedence of the input signal) from the source electrode S.

If the light is incident on the light-receiving film 16 (not shown in FIG. 5 for clarity), electric charges are generated in the pyroelectric material between the light-receiving part 15a just below the light-absorbing film 16 and a corresponding ground part 17a according to the temperature. When switches S1, S2, ..., Sn are closed and opened successively, a current flows down the resistor $R_g$ which is connected to the closed switch, and the voltage drop at the resistor $R_g$ drives a source-follower circuit of FET which transforms the impedence of the signal. Thus, ac output signal is taken out in time series as the voltage drop at $R_s$, superposed with the dc bias voltage. If the light is incident only on a part of the pyroelectric sensor, output signals appear only at the illuminated parts.

If a material which radiates the light is stationary, a chopper should be placed over first electrodes 15 above the upper surface of the pyroelectric sensor 11. In this case, the period that the switches S1, S2, ..., Sn are closed serially, that is, the rate of the scan should be much faster than the chopping rate of the chopper.

On the other hand, if the material is moving or the intensity of the radiation is varying, the rate of the scan should be much faster than the moving velocity of the material or the changing rate of the heat.

In a first embodiment mentioned above, the pyroelectric segments 14 are cantilevers so that the heat flows only through the one end of the pyroelectric segments 14. Thus, the loss of heat decreases and the sensitivity is improved. Furthermore, the cross talk due to thermal diffusion is suppressed because pyroelectric segments 14 are separated by the spaces 13 from each other.

Figure 6A:
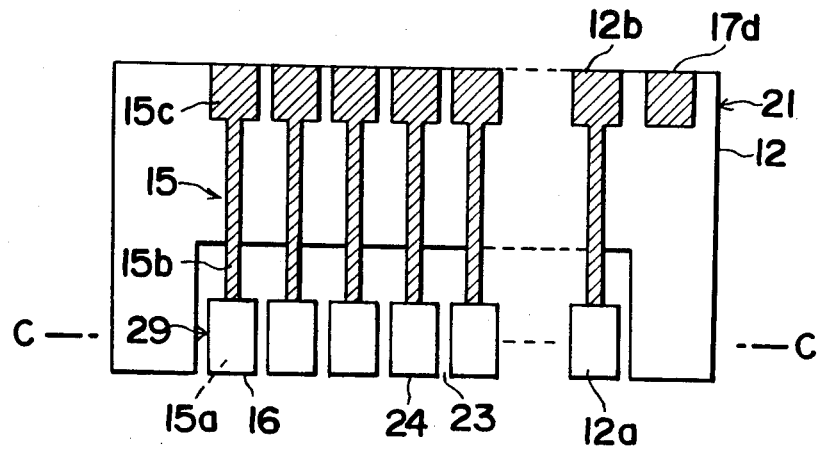
FIGS. 6(a), (b), (c) are a top plan view, a sectional view along line C—C in FIG. 6(a), and a sectional view along line D—D in FIG. 6(b) of a second embodiment according to the invention, respectively.
Figure 6B:
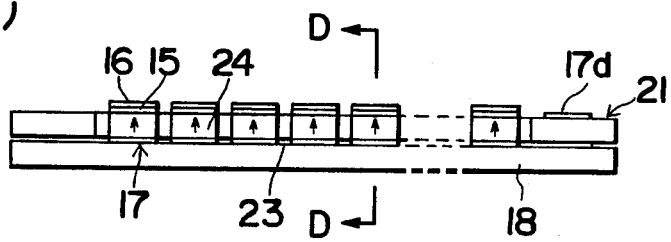
Figure 6C:
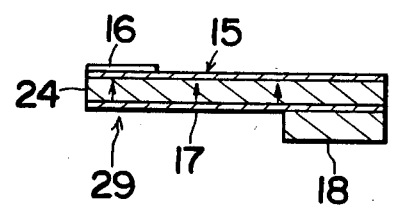

FIGS. 6(a), (b) and (c) are a plan view, a sectional view along line C—C in FIG. 6(a) and a sectional view along line D—D in FIG. 6(b), respectively, of a second embodiment 21 according to the present invention. The second embodiment 21 differs only in the shape of the pyroelectric segments 24 and the spaces 23 from the first embodiment 11. The spaces 23 are formed in the plate 12 so as to reduce the crosssectional area of a pyroelectric segment 24 on which the extension part 15b is formed. Thus, the loss of heat from the pyroelectric segments 24 decreases further, and the cross talk due to thermal diffusion is also suppressed further, when compared with that of the first embodiment 11.

Figure 7:
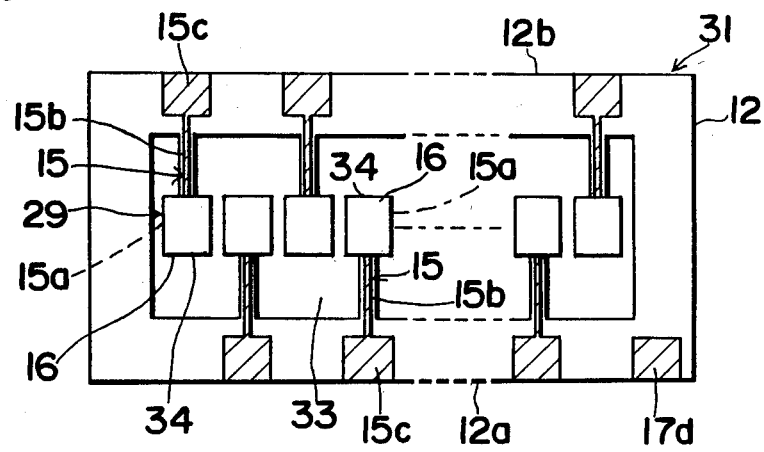
FIG. 7 is a top plan view of a third embodiment according to the invention.

FIG. 7 is a top plan view of a third embodiment 31 according to the present invention. A detector part 29 comprises a light-absorbing part 15a of a first electrode, a ground part 17a (not shown), pyroelectric material of pyroelectric segment 34 between them and a light-absorbing film 16 over the light-absorbing part 15a. Pyroelectric segments 34 extend in turn towards a side 12a or towards a side 12b. This makes connecting parts 15c also located in turn near the side 12b or near the side 12a. As is supposed from FIG. 2(b), second electrodes 17 including a ground part 17a, an extension part 17b and a connecting part 17c are formed on the bottom surface of the plate 12, and they are connected to a folded part 17d formed on the upper surface of the plate 12. Thus, detector parts 29 are arranged linearly along the central line of the plate 12 between sides 12a, 12b. The loss of heat from the pyroelectric segments 24 decreases further, and the cross talk due to thermal diffusion is also suppressed further, when compared with that of the first embodiment 11.

Because connecting parts 15c are formed alternately the area of each connecting part 15c can be made wider. Therefore, the lead wires can be connected more easily to the connecting parts 15c. Furthermore, the connecting parts 15c can be arranged densely.

Figure 8A:
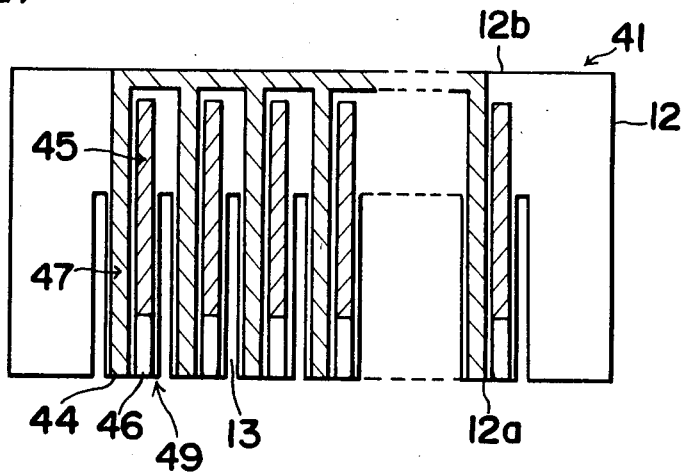
FIGS. 8(a), (b) are a top plan view and a fragmentary perspective view of a fourth embodiment of the present invention, respectively.
Figure 8B:
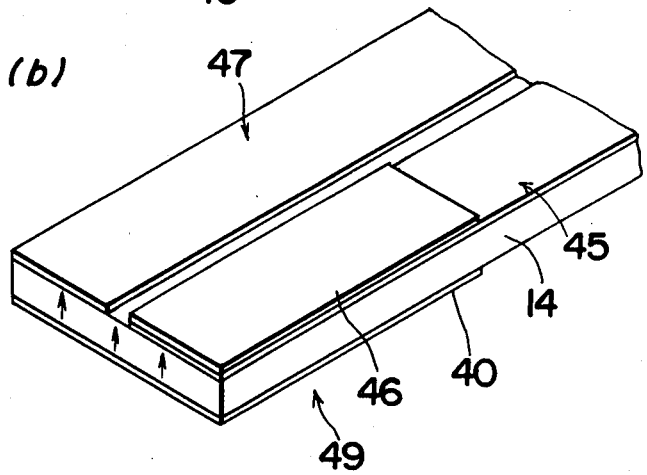
FIG. 8(c) is a top plan view of a modified example of the fourth embodiment according to the invention.
Figure 8C:
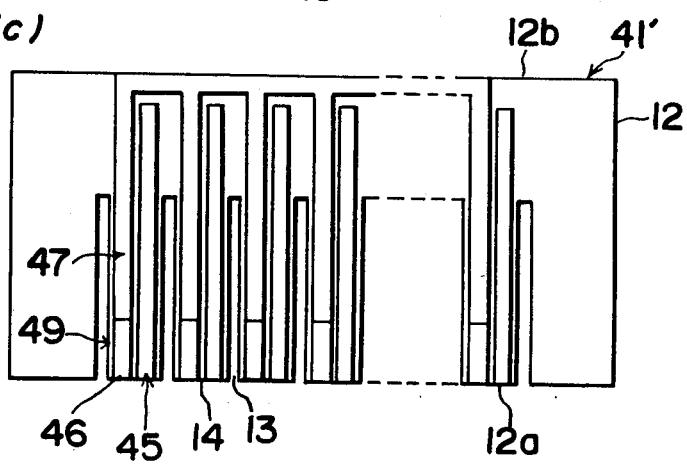

FIG. 8(a) and FIG. 8(b) are a plan view and a fragmentary perspective view of a fourth embodiment 41 according to the present invention, respectively. FIG. 8(c) is a plan view of a modified example of a fourth embodiment of the present invention.

In this embodiment, pyroelectric segments 14 are formed parallel to each other, separated by slit-like spaces 13. A first electrode 45 and a second electrode 47 of the same width are arranged on the same plane of a pyroelectric segment 14 parallel to each other, separated with a gap. A first electrode 45 extends from the free end of the pyroelectric segment 14 to the neighborhood of the side 12b. On the other hand, a second electrode 47 extends from the free end of the pyroelectric segment 14 to the side 12b, and the ends of all the second electrodes 47 are connected with each other along the side 12b. A light-absorbing film 46 is formed on a part of a first electrode 45 near the free end. A counter electrode 40 is formed on the rear surface of the pyroelectric segment 14 opposite the part of each first electrode 45 on which the light-absorbing film 46 is formed, and of each second electrode 47 parallel to the above-mentioned part, as shown in FIG. 9(b). A detector part 49 comprises a light-absorbing part 46, the above-mentioned parts of a first and second electrodes 45, 47, a counter electrode 40 and pyroelectric materials between them.

The direction of the polarization of the pyroelectric material is shown by the arrows in FIG. 8(b), but it may be the reverse.

A vibration-noise detector is formed near the free end of a pyroelectric segment 14 as will be explained below.

Alternately, the light-absorbing film 46 may be formed near the free end of a second electrode 47, as shown in FIG. 8(c).

It is desirable that a light-shading plate is put over a first or second electrode.

Figure 9A:
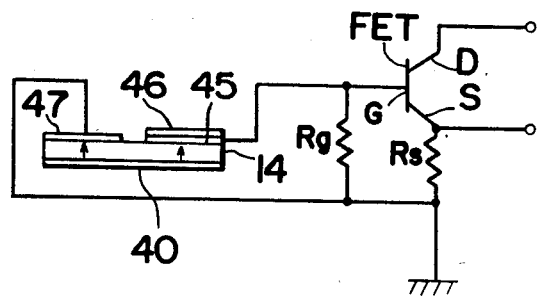
FIGS. 9(a), (b) are each an example of a schematic diagram of a driver circuit for the fourth embodiment.
Figure 9B:
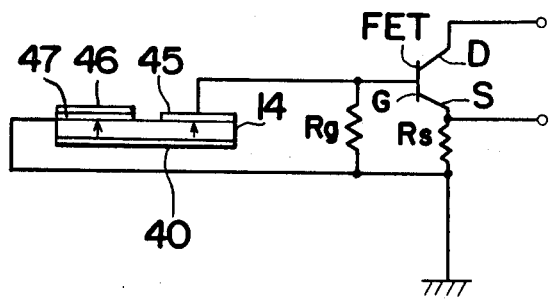

A pyroelectric sensor according to the fourth embodiment according to the invention can be driven as follows:

FIGS. 9(a), (b) show a driver circuits for a single pyroelectric detector as shown in FIGS. 8(a) and 8(c), respectively. A first electrode 45 is connected to a gate electrode G of FET. A resistor $R_g$ is connected between the first electrode 45 and the corresponding second electrode 47, which is connected to the ground. A dc voltage is applied to the drain electrode D of FET, while the source electrode S of FET is connected to the ground via a resistor $R_s$. The output signal is taken out from the source electrode S.

If the light is incident on the first electrode 45, charges are generated in the pyroelectric material between the electrodes 40, 45 in FIG. 9(a). Then, a current flows down the resistor $R_g$. The voltage drop at $R_g$ is taken out as the voltage drop at $R_s$ through a source follower circuit of FET which transforms the impedance of the input signal. Then, a dc or ac output signal is taken out from the source electrode S, superposed with the dc bias voltage.

The pyroelectric material is polarized in the same direction from the counter electrode 40 to the first and second electrodes 45, 47. Thus, a detector part 49 can be regarded to be equivalent to a circuit where two sensors are connected serially in reversed polarity.

If the light is incident on the detector part 49, electric charges are generated more in the pyroelectric material between the first and counter electrodes 45, 40 than in that between the second and counter electrodes 47, 40 due to the difference in the rate of light absorption. Thus, the detector part 49 can detect the intensity of the incident light.

An advantage of the fourth embodiment 41 or 41' is that any signal due to vibration is canceled so that the S/N ratio will be improved. Noises due to vibrations arise equivalently for both first and second electrodes 45, 47. Because the respective directions of the polarization are in reverse direction for first and second electrodes 45, 47, electric charges generated in the first and second electrodes 45, 47 have the opposite polarity to each other. Therefore, the signal due to vibrations will be canceled. A second electrode 47 and a counter electrode 40 therefore constitute a vibration noise detector.

In a pyroelectric sensor 41' shown in FIG. 8(c), a first electrode 45 and a counter electrode 40 (not shown) similarly constitute a vibration noise detector which can detect vibration noise.

FIGS. 9(a), (b) shows a driver circuit for a single detector part 49. In order to drive a linear array of detecting parts 49, a driver circuit can be composed as shown in FIGS. 4 and 5.

Figure 10A:
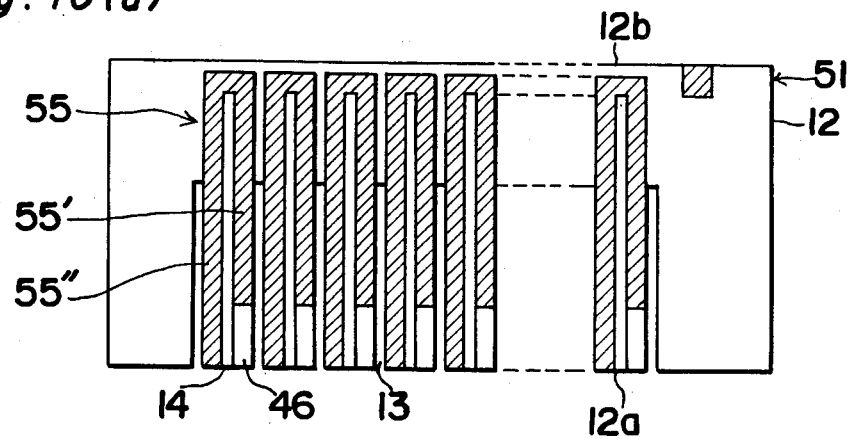
FIGS. 10(a), (b), (c) are a top plan view, a bottom plan and a fragmentary perspective view of a fifth embodiment according to the invention, respectively.

FIGS. 10(a), (b) and (c) are a top plan view, a bottom plan view and a fragmentary perspective view of a fifth embodiment 51 according to the present invention. This embodiment differs from the first embodiment (FIGS. 2(a)–(c)) in two points. First, a first electrode 55 is composed of two parallel parts 55', 55'' each having the same width and separated with a gap. Both parts 55', 55'' are connected with each other near the side 12b of a plate 12. A light-absorbing film 46 is formed on the free end of either a part 55' or 55''. Second, a shown by the arrows in FIG. 10(c), the direction of the polarization of pyroelectric segment 14 between the first part of the first electrode 55' and the second electrode 17, is opposite to the direction of polarization between the second part of the first electrode 55'' and the second electrode 17. A detector part 59 is formed near the free end of each pyroelectric segment 14.

In a process of polarizing the pyroelectric material as mentioned above, the two parts of first electrode 55, namely parts 55' and 55'' are separated from each other. Next, a dc voltage is applied between the first part of the first electrode 55' and the second electrode 17 to polarize in one direction, and then between the second part of the first electrode 55'' and the second electrode 17 to polarize in the reversed direction. Then, both parts of first electrodes 55' and 55'' are connected with each other electrically.

It is desirable that a light-shading plate is set over the second part of the first electrode 55''.

Figure 10B:
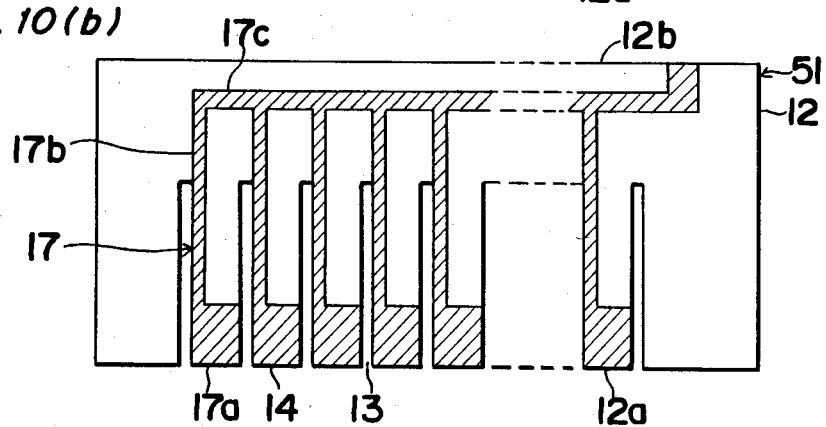
Figure 10C:
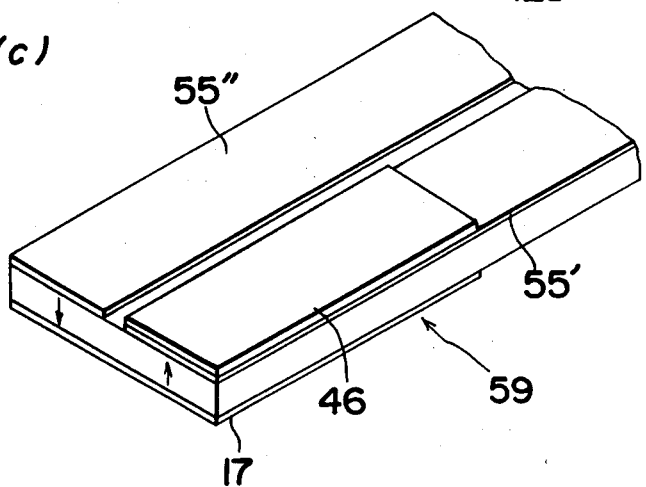
Figure 11A:
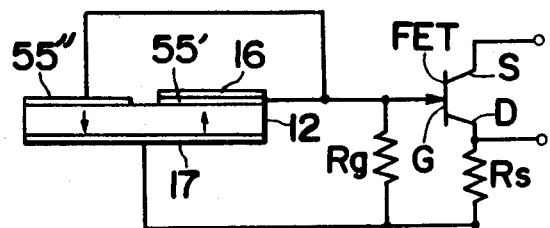
FIGS. 11(a), (b) are each an example of a driver circuit.

FIG. 11(a) is a driver circuit for a single detector part 59 of the fifth embodiment shown in FIGS. 10(a)–(c). This circuit is similar to that shown in FIG. 9(a) except that both parts of first electrodes 55' and 55'' are connected to the gate electrode G while the second electrode 17 is connected to ground.

Figure 11B:
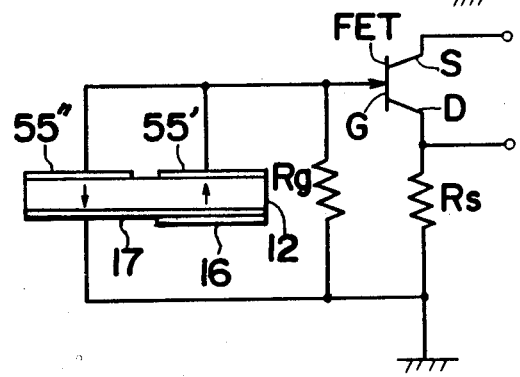

FIG. 11(b) is a driver circuit for a single detector part of a modified example of a fifth embodiment, where a light-absorbing film 46 is formed on the second electrode 17 below the free end of first electrode 55', and the light will be incident on the bottom surface. The heat absorbed in the light-absorbing film 46 diffuses into the second electrode 17 not only to the part on which the light-absorbing film 46 is formed, but also to the other part. Therefore, the amplitude of the output signal becomes lower because the difference in temperature becomes smaller between the two parts of the second electrode 17. Therefore, the structure shown in FIGS. 10(a)–(c) is better than that of the modified example shown in FIG. 11(b).

An advantage of the fifth embodiment 51 is that the signal due to vibrations is canceled so that the S/N ratio will be improved. In the fifth embodiment, a vibration noise detector is composed of the second part of the first electrode 55'' and the second electrode 17.

A driver circuit for a linear array of a pyroelectric detectors according to the fifth embodiment can be composed of the individual driver circuits shown in FIGS. 11(a), (b), similar to that shown in FIGS. 4 and 5.

Figure 12A:
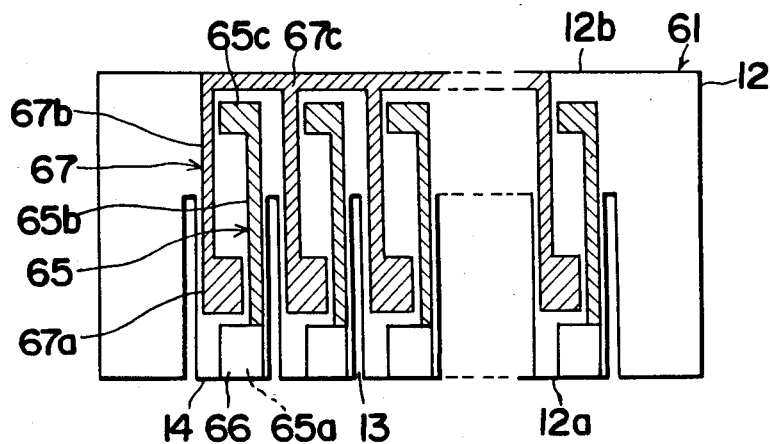
FIGS. 12(a), (b), (c) are a top plan view, a bottom plan view and a fragmentary perspective view of a sixth embodiment according to the invention, respectively.
Figure 12B:
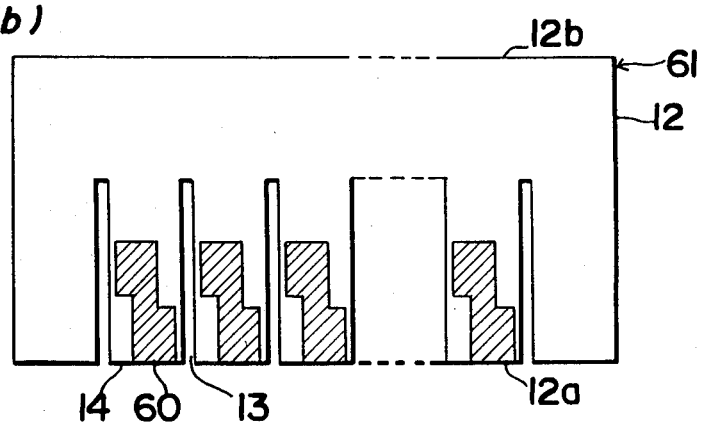
Figure 12C:
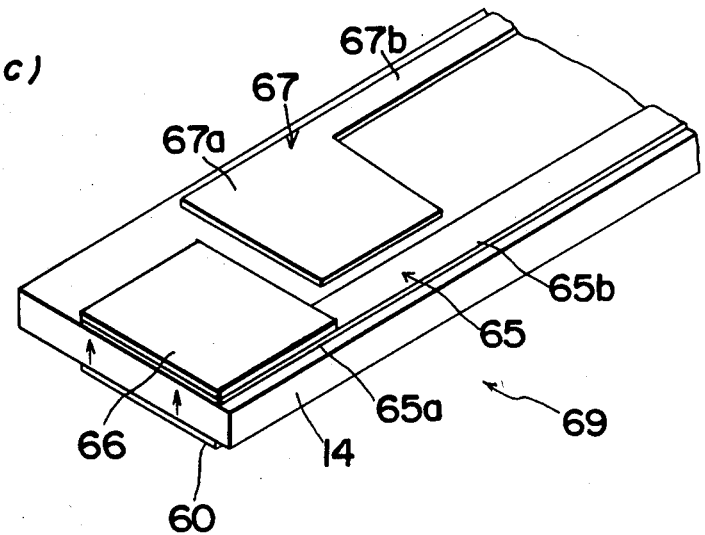

FIGS. 12(a)–(c) are a top plan view, a bottom plan view and a fragmentary perspective view of a sixth embodiment 61 according to the present invention, respectively. Principal differences of this embodiment from the first embodiment lie in the position of second electrodes 67 and the existence of counter electrodes 60. A second electrode 67 as well as a first electrode 65 is formed on the upper surface of a pyroelectric segment 14. A light-receiving part 65a of the first electrode 65 is located at the free end of the pyroelectric segment 14 near one side of the segment 14. The ground part 67a has the same area as the light-receiving part 65a, and is located near the latter 65a and near the other side of the segment 14. Then, the extension parts 67b extend from the ground part 67a to the common connecting part 67c at the side 12b of the plate 12. A counter electrode 60 is formed on the bottom surface of the pyroelectric segment 14; it consists of two parts just below the light-receiving part 65a and ground part 67a and a connecting part between them. The direction of the polarization of pyroelectric segment 14 is shown by the arrows shown in FIG. 12(c). It may be the reverse.

In this example, a light-absorbing film 66 is formed on the light-receiving part 65a. A detector part 69 consists of the light-receiving part 65a, the ground part 67a, the counter electrode 60, the pyroelectric material interposed between them and the light-absorbing film 66. Because the light-receiving part 65a is located at the free end of the pyroelectric segment 14, the heat diffuses only through the pyroelectric segment 14. Therefore, the sensitivity is improved, and the cross talk is reduced effectively.

An advantage of the sixth embodiment 61 is that any signal due to vibrations is canceled so that the S/N ratio will be improved. A vibration-noise detector is composed of a second electrode 67 and a counter electrode 60.

It is desirable that a light-shading plate is set over the second electrode 67.

A driver circuit shown in FIGS. 4 and 5 can be used to drive a pyroelectric detector of the sixth embodiment.

Figure 13:
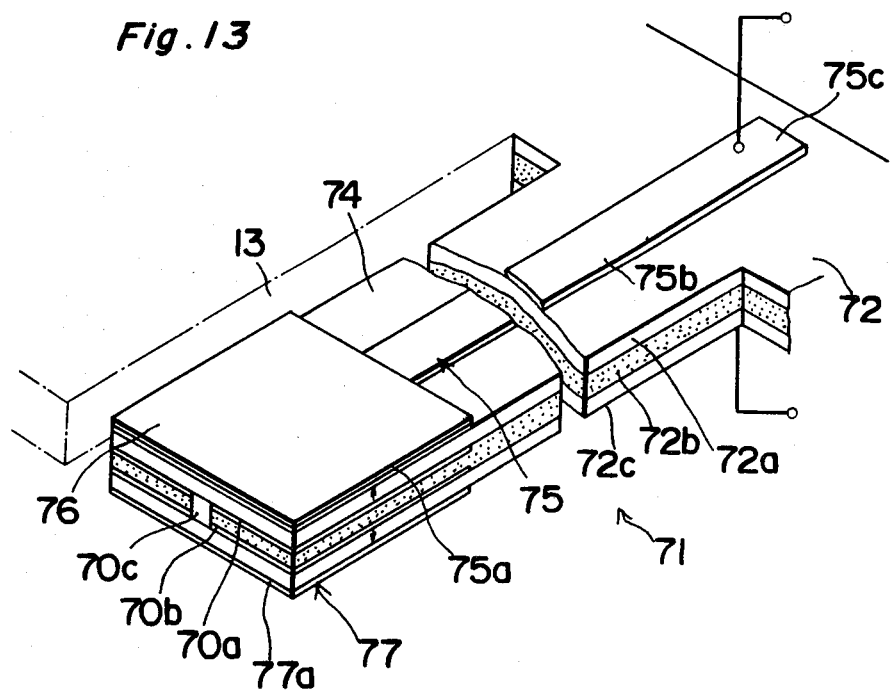
FIG. 13 is a fragmentary perspective view of a seventh embodiment according to the invention.

FIG. 13 is a fragmentary perspective view of a pyroelectric sensor 71 of the linear array type of a seventh embodiment 71 according to the present invention. A plate 72 is composed of a first pyroelectric layer 72a, a heat-insulating layer 72b and a second pyroelectric layer 72c, each applied on another in this series. Pyroelectric segments 74 are separated by slit-like spaces 13 formed parallel to each other as in the first embodiment. A first electrode 75 is formed on the first pyroelectric layer 72a, and it comprises a light-receiving part 75a near the free end of the pyroelectric segment 74, an extension part 75b extending from the light-receiving part 75a to the base of the plate 72, and a connecting part 75c near a side of the plate 72. A light-receiving film 76 is formed on the light-receiving part 75a. A first intermediate electrode 70a is formed on the bottom surface of the pyroelectric layer 72a just below the light-receiving part 75a. A second electrode 77 is formed on the bottom surface of the second pyroelectric layer 72c and it also consists of a ground part 77a, an extension part (not shown) and a connecting part (not shown). The ground part 77a is formed counter to the light-receiving part 75a at the corresponding position. The connecting part (not shown) at the end of the extension part is formed similar to the connecting part 75c, and is connected with the neighboring connecting parts electrically.

A second intermediate electrode 70b is formed on the top surface of the second pyroelectric layer 72c just above the ground part 77a.

A connecting electrode 70c is formed on the side of the free end of the pyroelectric segment 74 to connect the first and second intermediate electrodes 70a and 70b electrically.

The directions of the polarization of the pyroelectric layers 72a and 72c are shown by the arrows in FIG. 13. They may be the reverse.

In a process of producing a pyroelectric sensor of the seventh embodiment, first, a first pyroelectric layer 72a, a heat-insulating layer 72b and a second pyroelectric layer 72c are prepared. Then, first electrodes 75 and first intermediate electrodes 70a are formed on the first pyroelectric layer 72a, and second electrodes 77 and second intermediate electrodes 70b are formed on the second pyroelectric layer 72c. They are layered, and connected with a bonding agent. Then, connecting electrodes 70c are formed.

In a polarization provess, both first and second electrodes 75, 77 are connected to the one output terminal of the dc power supply, while the connecting electrodes 70c are connected to the other output terminal. In another way, pyroelectric layers 72a, 72c polarized previously may be adhered with a heat-insulating layer 72b. In a further way, pyroelectric layers 72a, 72c and heat-insulating layer 72b all not fired previously can be integrated by layering and firing them.

Pyroelectric plates 72 can be produced as shown in FIG. 3. First, a plurality of pyroelectric plates 72 are layered. After being fixed with wax, slit-like spaces 13 are formed. Then, pyroelectric plates 72 are separated.

Figure 14:
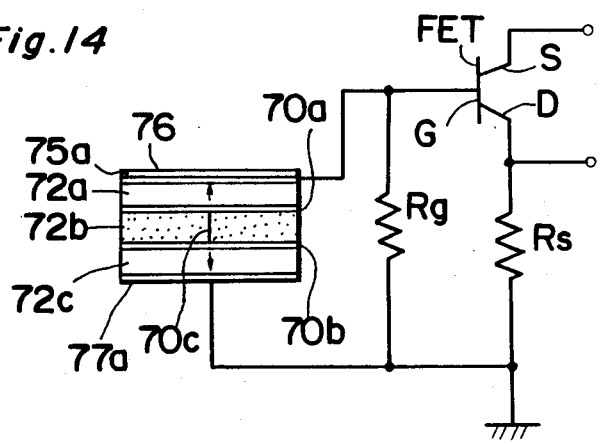
FIG. 14 is an example of a driver circuit.

FIG. 14 is a driver circuit for a single detector part. A first electrode 75a is connected to the gate electrode G of FET, while a second electrode 77a to the ground.

The principle of the circuit is similar to that shown in FIG. 9(a).

If a light is incident on the light-absorbing layer 76, the temperature of the first pyroelectric layer 72a below the light-absorbing layer 76 rises. On the other hand, the heat diffusion to the second pyroelectric layer 77 is hindered by the heat-insulating layer 72b. Because the equivalent circuit of the detector part can be taken as a reverse serial connection of two pyroelectric sensors, vibration noises can be canceled. Then, the amount of the electric charges generated by the incident light can be detected effectively and the S/N ratio is improved. A vibration noise detector is composed of a ground part 77a of a second electrode 77 and a second intermediate electrode 70b.

Figure 15A:
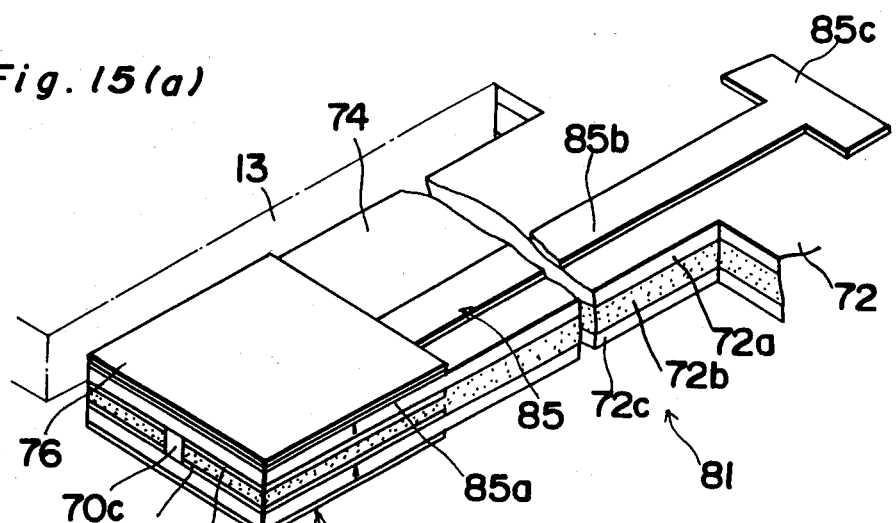
FIGS. 15(a), (b), (c) are a fragmentary perspective view, a fragmentary top plan view, and a fragmentary elevational view of an eighth embodiment according to the invention, respectively.

FIGS. 15(a), (b) and (c) are a fragmentary perspective view, a fragmentary plan view and a fragmentary elevational view of an eighth embodiment 81 according to the present invention. A principal difference of this embodiment from the seventh embodiment shown in FIG. 13 is that the directions of the polarization of pyroelectric layers 72a and 72c are the same as shown by the arrows in FIG. 15(c). The directions may be the reverse.

Figure 15B:
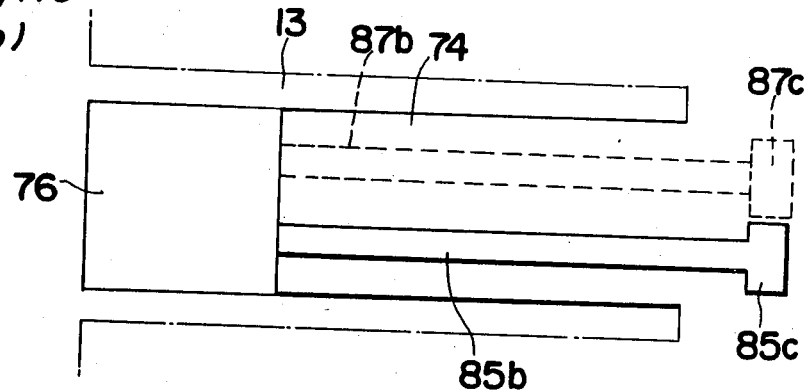
Figure 15C:
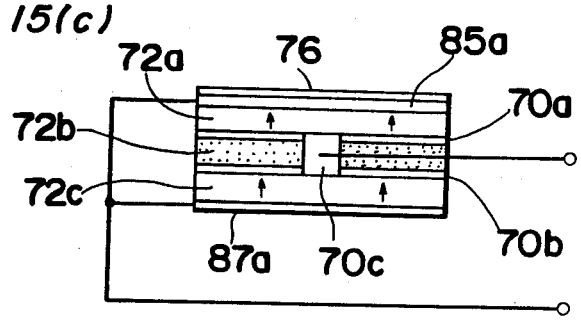

FIG. 15(b) displays the extension part 87b and the connecting part 87c both not shown in FIG. 13 each corresponding to the parts 77b, 77c.

Figure 16:
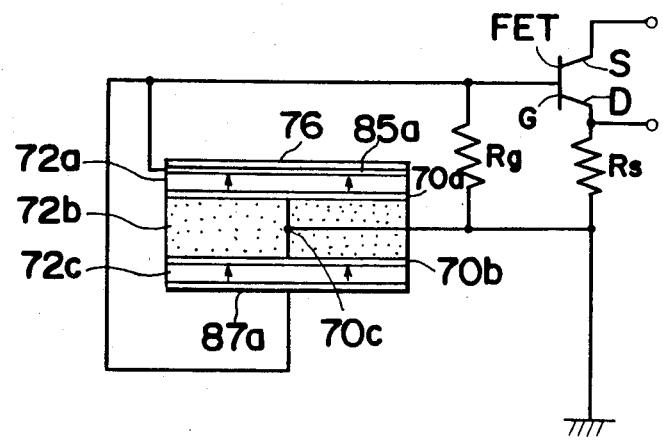
FIG. 16 is an example of a driver circuit.

FIG. 16 is a driver circuit for a single detector part according to the eighth embodiment. Both first and second electrtodes 85 and 87 are connected parallel to the gate electrode G and the connecting electrode 70c is connected to the ground, similar to the driver circuit (FIG. 11(a)) for the fifth embodiment.

The principle of the driver circuit is similar to that shown in FIG. 10(a).

Both first and second pyroelectric layers 72a and 72b are insulated thermally from each other, as in the seventh embodiment. Therefore, when the light is incident on the light-absorbing film 76, the temperature of the light-receiving part 85a rises, but the thermal diffusion to the ground part 87a is hindered. Thus, the amount of the electric charges generated by the incident light can be detected effectively. On the other hand, vibration noises are canceled. Therefore, the S/N ratio increases, the sensitivity is improved and the cross talk decreases. A vibration noise detector is composed on the second intermediate electrode 70b and the ground part 87a.

A driver circuit for a whole sensor can be composed of the circuit shown in FIG. 16, similar to that shown in FIGS. 4 and 5.

While the embodiments of the present invention, as herein disclosed, constitute preferred forms, it is to be understood that other forms might be adopted.

What is claimed is:

1. A one-dimensional pyroelectric sensor array which comprises:

a base plate made of a pyroelectric material;

a plurality of strip elements made of pyroelectric material and having a free end and another end, said strip elements each having a heat-sensitive region at said free end thereof, and each being supported only at the other end to the base plate to form an integrated structure with the base plate, each of said strip elements being separated from each adjacent strip element at portions thereof away from said base plate; and at least one pair of detecting electrodes formed on the heat-sensitive region of the free end of each strip element.

2. A one-dimensional pyroelectric sensor array according to claim 1, wherein said strip elements are rectangular.

3. A one-dimensional pyroelectric sensor array according to claim 1, wherein said strip elements become narrower away from the region on which said detecting electrodes are formed.

4. A one-dimensional pyroelectric sensor array according to claim 1, wherein a light-absorbing layer is formed on one of said at least one pair of detecting electrodes.

5. A one-dimensional pyroelectric sensor array according to claim 1, wherein conductive films narrower than said strip elements are formed on said strip elements, extending from said detecting electrodes to a side end of said base plate.

6. A one-dimensional pyroelectric sensor array according to claim 1, wherein said detecting electrodes are arranged on opposite sides of said strip element from each other.

7. A one-dimensional pyroelectric sensor array according to claim 6, wherein the direction of the polarization of said pyroelectric material is perpendicular to said detecting electrodes.

8. A one-dimensional pyroelectric sensor array according to claim 6, wherein one of said detecting electrodes has two parts connected electrically with each other, and the directions of the polarization of the pyroelectric material between one of the parts and the other electrode and between the other of the parts and the other electrode are antiparallel to each other.

9. A one-dimensional pyroelectric sensor array according to claim 1, wherein said at least one pair of electrodes is formed parallel to each other on one plane of said strip element.

10. A one-dimensional pyroelectric sensor array according to claim 9, wherein a third electrode is formed on a plane which is counter to said plane on which said at least one pair of electrodes is formed.

11. A one-dimensional pyroelectric sensor array according to claim 10, wherein the direction of the polarization of said pyroelectric material is perpendicular to said electrodes.

12. A one-dimensional pyroelectric sensor array according to claim 10, wherein the direction of the polarization of said pyroelectric material interposed between one of said at least one pair of electrodes and said third electrode is antiparallel to that between the other of the at least one pair of electrodes and the third electrode.

13. A one-dimensional pyroelectric sensor array according to claim 1, wherein said base plate and said strip elements are composed of a first pyroelectric layer, a heat-insulating layer and a second pyroelectric layer each applied to the other successively;
a first pair of detecting electrodes being applied on the first pyroelectric layer and on the second pyroelectric layer of each strip element, respectively; and
a second pair of detecting electrodes being interposed each bewteen the first pyroelectric layer and the heat-insulating layer and between the heat-insulating layer and the second pyroelectric layer, which second pair of detecting electrodes being connected electrically.

14. A one-dimensional pyroelectric sensor array according to claim 13, wherein said first pyroelectric layer and said second pyroelectric layer are polarized in the same direction.

15. A one-dimensional pyroelectric sensor array according to claim 13, wherein said first pyroelectric layer and said second pyroelectric layer are polarized in the reverse direction with each other.

16. A one-dimensional pyroelectric sensor array according to claim 5, wherein a pair of said conductive films extend from respective said detecting electrodes on opposite sides of said strip element, said pair of conductive films being offset from each other for minimizing the capacitance therebetween.

* * * * *